(12) United States Patent
Tsai et al.

(10) Patent No.: US 12,388,062 B2
(45) Date of Patent: Aug. 12, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Wen-Jung Tsai, Taichung (TW); Chih-Hsien Chiu, Taichung (TW); Chin-Chiang He, Taichung (TW); Ko-Wei Chang, Taichung (TW); Chien-Cheng Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 483 days.

(21) Appl. No.: 17/956,653

(22) Filed: Sep. 29, 2022

(65) Prior Publication Data

US 2024/0047440 A1 Feb. 8, 2024

(30) Foreign Application Priority Data

Aug. 4, 2022 (TW) .................................. 111129376

(51) Int. Cl.
| | |
|---|---|
| *H01L 25/16* | (2023.01) |
| *H01L 21/56* | (2006.01) |
| *H01L 23/31* | (2006.01) |
| *H01L 23/498* | (2006.01) |
| *H01L 23/552* | (2006.01) |
| *H01L 23/58* | (2006.01) |

(52) U.S. Cl.
CPC ............ *H01L 25/165* (2013.01); *H01L 21/56* (2013.01); *H01L 23/3121* (2013.01); *H01L 23/49811* (2013.01); *H01L 23/552* (2013.01); *H01L 23/585* (2013.01)

(58) Field of Classification Search
CPC ... H01L 25/165; H01L 21/56; H01L 23/3121; H01L 23/49811; H01L 23/552; H01L 23/585
See application file for complete search history.

(56) References Cited

U.S. PATENT DOCUMENTS

| | | | |
|---|---|---|---|
| 2015/0325529 A1* | 11/2015 | Choi | H01L 21/561 257/723 |
| 2018/0090449 A1* | 3/2018 | Jeong | H01L 23/552 |
| 2019/0103365 A1* | 4/2019 | Singh | H01L 23/552 |

* cited by examiner

*Primary Examiner* — Peniel M Gumedzoe
(74) *Attorney, Agent, or Firm* — Studebaker Brackett PLLC (57) ABSTRACT

An electronic package is provided and includes at least one electronic element, at least one first conductive structure and a second conductive structure disposed on one side of a carrier structure with at least one circuit layer, and an encapsulation layer covering the electronic element, the first conductive structure and the second conductive structure, where the first conductive structure is exposed from the encapsulation layer to externally connect required elements according to functional requirements.

20 Claims, 8 Drawing Sheets

FIG. 4

ELECTRONIC PACKAGE AND MANUFACTURING METHOD THEREOF

BACKGROUND

1. Technical Field

The present disclosure relates to a semiconductor device, and more particularly, to a dual-sided package electronic package and manufacturing method thereof.

2. Description of Related Art

With the evolution of semiconductor technology, electronic products are gradually moving towards the trend of multi-function and high performance. At present, the fourth generation (4G) wireless transmission communication technology has been widely used in various consumer electronic products to receive or send various wireless signals.

However, with the rapid development of wireless communication and the increasing flow of internet resources, the required wireless transmission bandwidth is also increasing. Therefore, the fifth generation (5G) wireless transmission technology is being actively developed.

Figure 1:
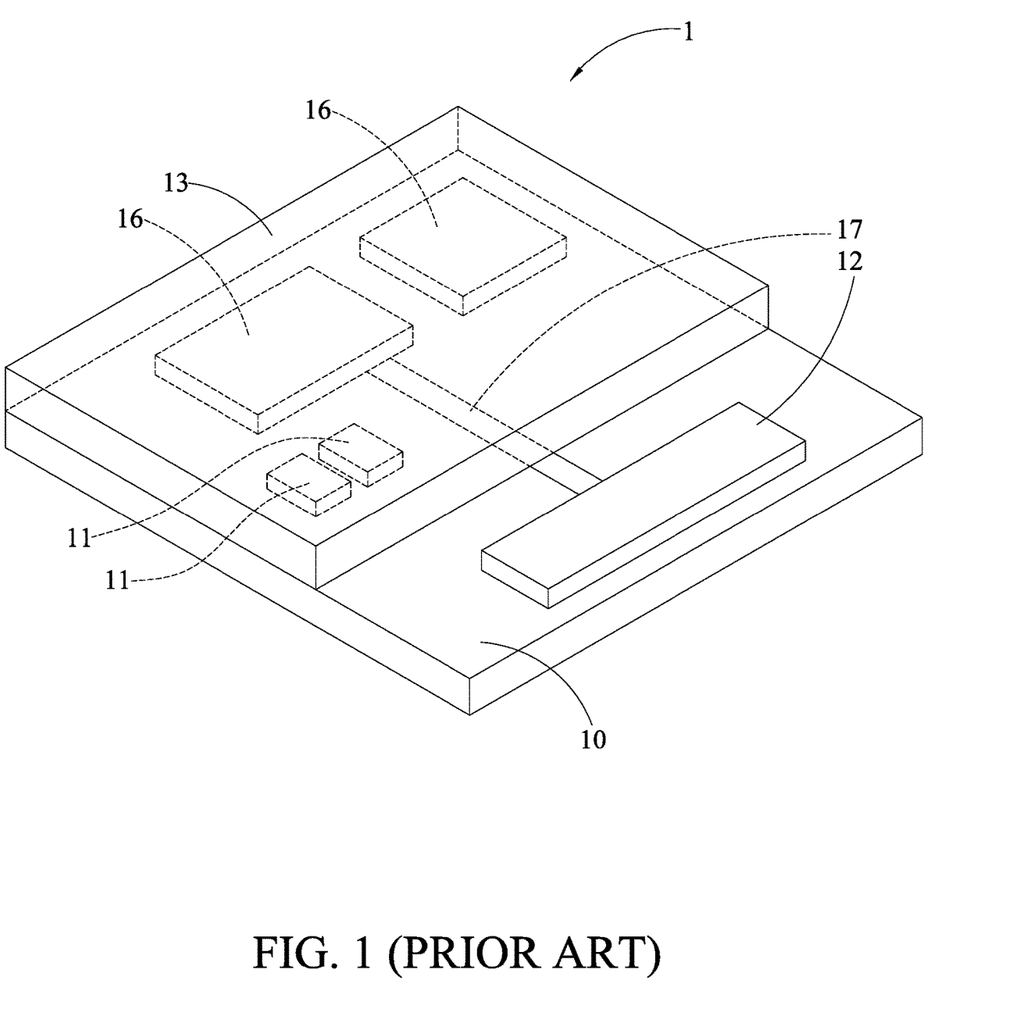
FIG. 1 is a schematic cross-sectional view of a conventional semiconductor package.

FIG. 1 is a schematic perspective view of a conventional semiconductor package 1. The semiconductor package 1 includes: a package substrate 10 configured with semiconductor elements 16 and passive elements 11, a radio-frequency element 12 such as an antenna, and an encapsulant 13. At least one of the semiconductor elements 16 is connected to the radio-frequency element 12 by a transmission line 17. The encapsulant 13 covers the semiconductor elements 16 and a portion of the transmission line 17.

However, in the conventional semiconductor package 1, a large number of semiconductor elements 16 and passive elements 11 need to be arranged according to functional requirements (such as antennas), so that a layout area of the package substrate 10 needs to be increased accordingly, and thus a volume of the semiconductor package 1 is increased, such that it is difficult for the semiconductor package 1 to meet the requirements of being light, thin and short.

Therefore, there is a need for a solution that addresses the aforementioned shortcomings in the prior art.

SUMMARY

In view of the aforementioned shortcomings of the prior art, the present disclosure provides an electronic package, which comprises: a carrier structure having at least one circuit layer and being defined with a first side and a second side opposing the first side; at least one second electronic element disposed on the second side of the carrier structure and electrically connected to the circuit layer; at least one first conductive structure disposed on the second side of the carrier structure and electrically connected to the circuit layer; an encapsulation layer formed on the second side of the carrier structure to cover the second electronic element and the first conductive structure, the encapsulation layer being defined with a first encapsulation portion and a second encapsulation portion that are integrally formed, wherein the second electronic element is located in the first encapsulation portion, and the first conductive structure is located in the second encapsulation portion, wherein a height of the first encapsulation portion is greater than a height of the second encapsulation portion, and the first conductive structure is exposed from the second encapsulation portion; and a second conductive structure disposed on the second side of the carrier structure and electrically connected to the circuit layer, wherein the second conductive structure has a composition different from a composition of the first conductive structure.

The present disclosure further provides a method of manufacturing an electronic package, the method comprises: providing a carrier structure having at least one circuit layer, the carrier structure being defined with a first side and a second side opposing the first side; disposing at least one second electronic element and at least one first conductive structure on the second side of the carrier structure, wherein the second electronic element and the first conductive structure are electrically connected to the circuit layer; forming an encapsulation layer on the second side of the carrier structure to cover the second electronic element and the first conductive structure, the encapsulation layer being defined with a first encapsulation portion and a second encapsulation portion that are integrally formed, wherein a height of the first encapsulation portion is greater than a height of the second encapsulation portion, wherein the second electronic element is located in the first encapsulation portion, and the first conductive structure is located in the second encapsulation portion and exposed from the second encapsulation portion; and forming a second conductive structure on the second side of the carrier structure, wherein the second conductive structure is electrically connected to the circuit layer, wherein the second conductive structure has a composition different from a composition of the first conductive structure.

In the aforementioned electronic package and method, the first conductive structure is a solder ball or a metal pillar.

In the aforementioned electronic package and method, the second conductive structure is a conductive adhesive.

In the aforementioned electronic package and method, a portion of a surface of the second side of the carrier structure is exposed from the encapsulation layer to connect to an electronic connector.

In the aforementioned electronic package and method, the first encapsulation portion has a contour in concave-convex shape.

In the aforementioned electronic package and method, the present disclosure further comprises disposing a circuit structure carrying the first conductive structure on the second side of the carrier structure.

In the aforementioned electronic package and method, the present disclosure further comprises disposing at least one first electronic element and a circuit board on the first side of the carrier structure, wherein the first electronic element and the circuit board are electrically connected to the circuit layer. For example, the circuit board is in a form of a ring frame. Alternatively, the present disclosure further comprises forming a plurality of conductive elements on the circuit board to connect to an electronic device.

In the aforementioned electronic package and method, the present disclosure further comprises forming a shielding structure on the encapsulation layer, wherein the shielding structure is electrically connected to the second conductive structure.

As can be understood from the above, in the electronic package and manufacturing method thereof according to the present disclosure, the first conductive structure is disposed on the second side of the carrier structure and exposed from the encapsulation layer so as to externally connect required elements according to functional requirements, so that a layout area of the carrier structure can be designed based on a mold of the encapsulation layer without increasing the layout area of the carrier structure. Therefore, compared with the prior art, the present disclosure can reduce the volume of the electronic package to meet the requirements of being light, thin and short in the electronic package.

In addition, the second conductive structure is designed to shield a surrounding of the second electronic element, so that the second electronic element and the first conductive structure will not interfere with each other electromagnetically, thereby improving the reliability of the end product.

BRIEF DESCRIPTION OF THE DRAWINGS

FIG. 2A-1, FIG. 2B to FIG. 2E-1 and FIG. 2F are schematic cross-sectional views illustrating a manufacturing method of an electronic package of the present disclosure.

FIG. 2A-2 is a schematic top plan view of a circuit board of FIG. 2A-1.

FIG. 2E-2 is a schematic top plan view of FIG. 2E-1.

DETAILED DESCRIPTION

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as falling within the scope covered by the technical contents disclosed herein. Meanwhile, terms such as "above," "on," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 2A-1, FIG. 2B to FIG. 2E-1 and FIG. 2F are schematic cross-sectional views illustrating a manufacturing method of an electronic package 2 of the present disclosure.

Figure 2A:
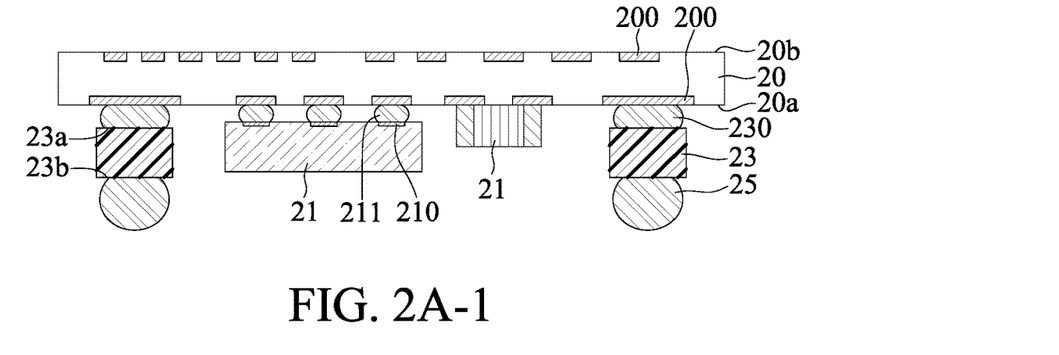

As shown in FIG. 2A-1, a circuit board 23 is disposed on a carrier structure 20, and at least one first electronic element 21 is disposed on the carrier structure 20.

In an embodiment, the carrier structure 20 has a first side 20a and a second side 20b opposing the first side 20a and is for example a package substrate with a core layer or a coreless package substrate, and the carrier structure 20 has an insulating base body and at least one circuit layer 200 bonded with the insulating base body. The circuit layer 200 is, for example, a fan-out type redistribution layer (RDL), wherein circuits (not shown) are arranged in the carrier structure 20 to communicate the circuit layers 200 on the first side 20a and the second side 20b. For example, the material for forming the circuit layer 200 is, for instance, copper, and the material for forming the insulating base body is a dielectric material such as polybenzoxazole (PBO), polyimide (PI), or prepreg (PP), etc.

Further, the first electronic element 21 is disposed on the first side 20a of the carrier structure 20 (a plurality of first electronic elements 21 are also used in the embodiment), and the first electronic element 21 is an active element, a passive element, or a combination of the active element and the passive element, etc., wherein the active element is such as a semiconductor chip, and the passive element is such as a resistor, a capacitor, or an inductor. For example, if the first electronic element 21 is a semiconductor chip, electrode pads 210 thereof can be disposed on and electrically connected to the circuit layer 200 via a plurality of conductive bumps 211 such as solder material in a flip-chip manner; alternatively, the electrode pads 210 of the first electronic element 21 can be electrically connected to the circuit layer 200 via a plurality of bonding wires (not shown) in a wire bonding manner; or, the electrode pads 210 of the first electronic element 21 can be electrically connected directly to the circuit layer 200. However, the manner in which the first electronic element 21 is electrically connected to the carrier structure 20 is not limited to the above.

Figure 2A:
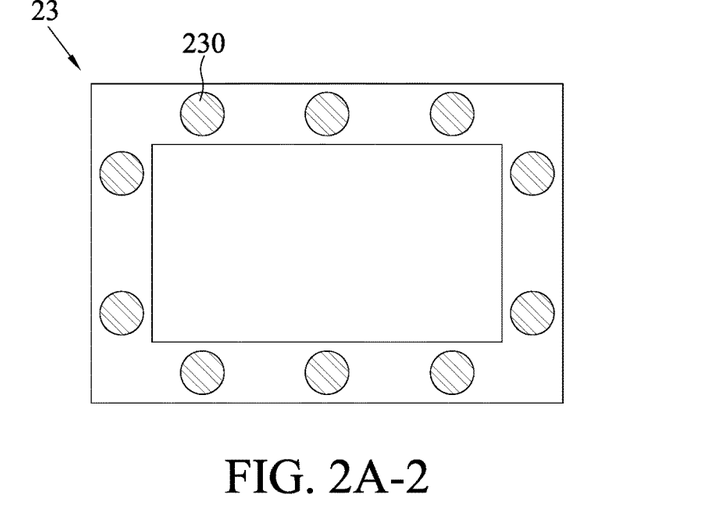

Furthermore, the circuit board 23 has a first surface 23a and a second surface 23b opposing the first surface 23a, and the circuit board 23 is bonded onto the circuit layer 200 of the first side 20a of the carrier structure 20 with the first surface 23a thereof via conductors 230 such as solder material. For example, the circuit board 23 is in the form of a ring/annular frame, as shown in FIG. 2A-2, and surrounding the plurality of first electronic elements 21.

In addition, a plurality of conductive elements 25 such as solder bumps may be formed on the second surface 23b of the circuit board 23.

Figure 2B:
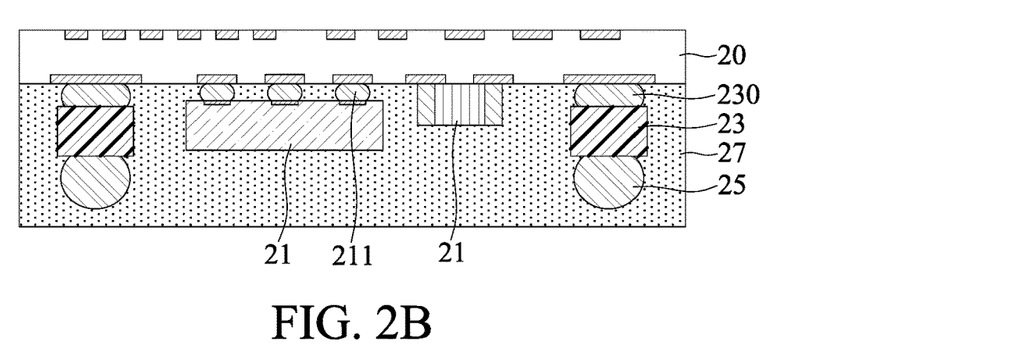

As shown in FIG. 2B, a packaging layer 27 is formed on the first side 20a of the carrier structure 20 to cover the first electronic elements 21, the circuit board 23 and the conductive elements 25.

In an embodiment, the packaging layer 27 is made by an insulating material such as polyimide (PI), dry film, epoxy resin, or molding compound, etc., but the present disclosure is not limited to as such. For example, the packaging layer 27 can be formed on the first side 20a of the carrier structure 20 in a manner of lamination or molding, etc.

Further, the packaging layer 27 is filled between the first electronic element 21 and the first side 20a of the carrier structure 20 to cover the conductive bumps 211, and is filled between the circuit board 23 and the first side 20a of the carrier structure 20 to cover the conductors 230; alternatively, an underfill (not shown) can be first filled between the first electronic element 21 and the first side 20a of the carrier structure 20 to cover the conductive bumps 211, and the underfill is also filled between the circuit board 23 and the first side 20a of the carrier structure 20 to cover the conductors 230, and then the underfill is covered by the packaging layer 27.

Figure 2C:
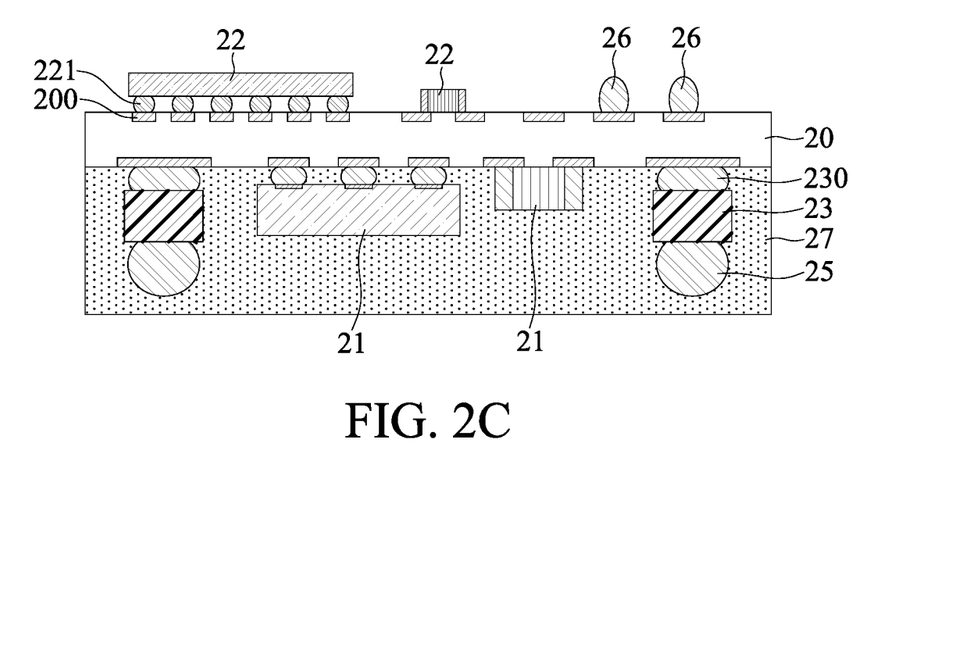

As shown in FIG. 2C, at least one second electronic element 22 and at least one first conductive structure 26 are disposed on the second side 20b of the carrier structure 20 (a plurality of second electronic elements 22 and a plurality of first conductive structures 26 are also used in the embodiment).

In an embodiment, the second electronic element 22 is an active element, a passive element, or a combination of the active element and the passive element, etc., wherein the active element is such as a semiconductor chip, and the passive element is such as a resistor, a capacitor, or an inductor. For example, if the second electronic element 22 is a semiconductor chip, the second electronic element 22 can be disposed on and electrically connected to the circuit layer 200 of the second side 20b of the carrier structure 20 via a plurality of conductive bumps 221 such as solder material in a flip-chip manner; alternatively, the second electronic element 22 may be electrically connected to the circuit layer 200 via a plurality of bonding wires (not shown) in a wire bonding manner; or, the second electronic element 22 may directly contact the circuit layer 200. However, the manner in which the second electronic element 22 is electrically connected to the carrier structure 20 is not limited to the above.

Figure 3A:
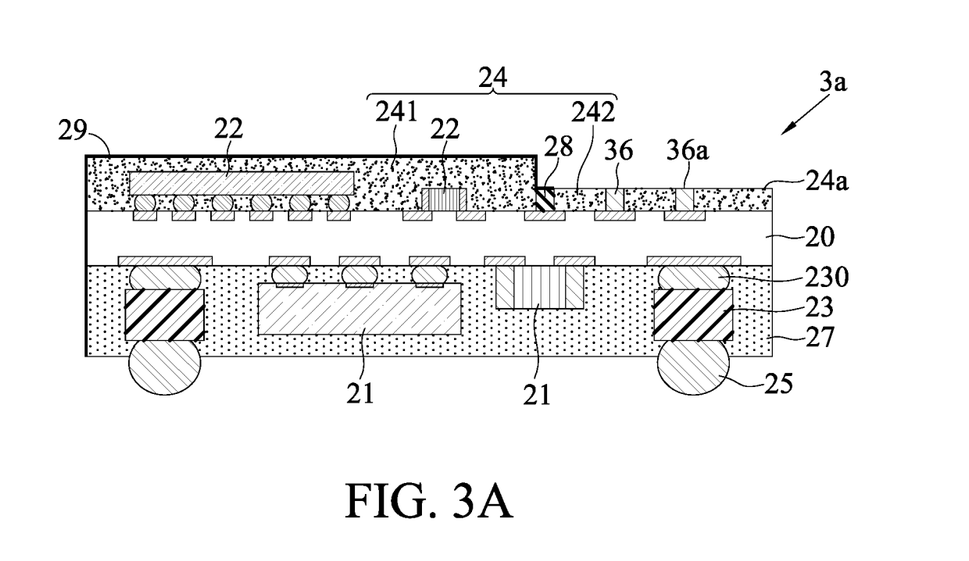
FIG. 3A, FIG. 3B and FIG. 3C are schematic cross-sectional views showing other aspects of FIG. 2F.

Further, the first conductive structure 26 is in a shape of a sphere, a column, or other three-dimensional bumps, and is electrically connected to the circuit layer 200 on the second side 20b of the carrier structure 20. For example, in an embodiment, solder balls are used as the first conductive structures 26; or, in another embodiment, in an electronic package 3a as shown in FIG. 3A, metal pillars such as copper pillars can be used as first conductive structures 36.

Figure 2D:
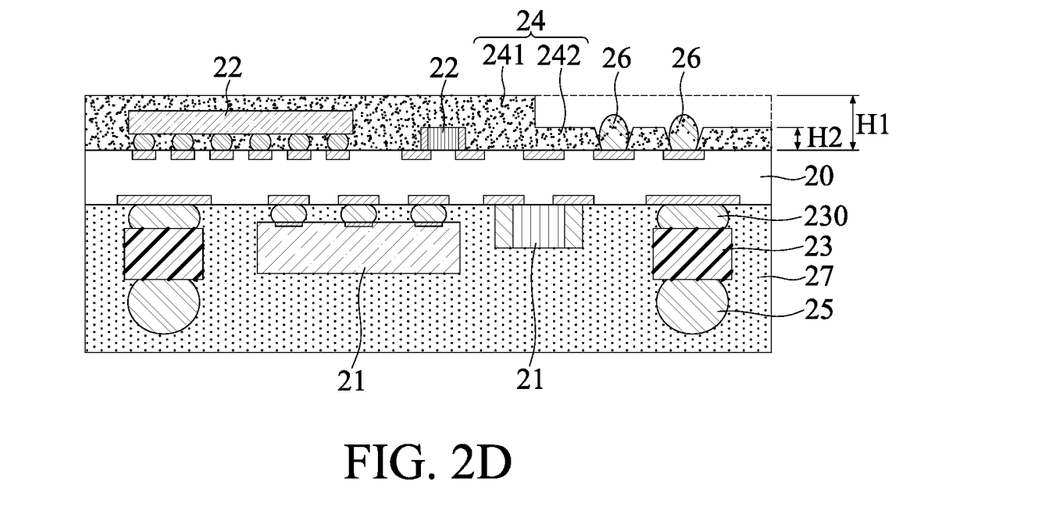

As shown in FIG. 2D, an encapsulation layer 24 is formed on the second side 20b of the carrier structure 20 to cover the second electronic elements 22 and the first conductive structures 26.

In an embodiment, the encapsulation layer 24 is made by an insulating material such as polyimide (PI), dry film, encapsulant such as epoxy resin, or molding compound. For example, the encapsulation layer 24 can be formed on the carrier structure 20 in a manner of liquid compound, injection, lamination, or compression molding, etc.

Further, the encapsulation layer 24 is defined with a first encapsulation portion 241 covering the second electronic elements 22 and a second encapsulation portion 242 covering the first conductive structures 26, wherein a height H1 of the first encapsulation portion 241 is higher/greater than a height H2 of the second encapsulation portion 242. For example, a part of the material of the encapsulation layer 24 at the first conductive structures 26 is removed via grinding (the dotted area shown in FIG. 2D) to form the second encapsulation portion 242, so that a contour of the encapsulation layer 24 has a notch or a concave-convex shape, wherein part of the material of the encapsulation layer 24 can be removed by various ways such as etching, laser, milling tools, etc., and the present disclosure is not limited to as such. Alternatively, a molding method can also be used to directly form the encapsulation layer 24 with a contour of a notch or a concave-convex shape by a mold without removing part of the material of the encapsulation layer 24. Therefore, there are many ways to fabricate the encapsulation layer 24, which are not limited to the above.

Figure 3B:
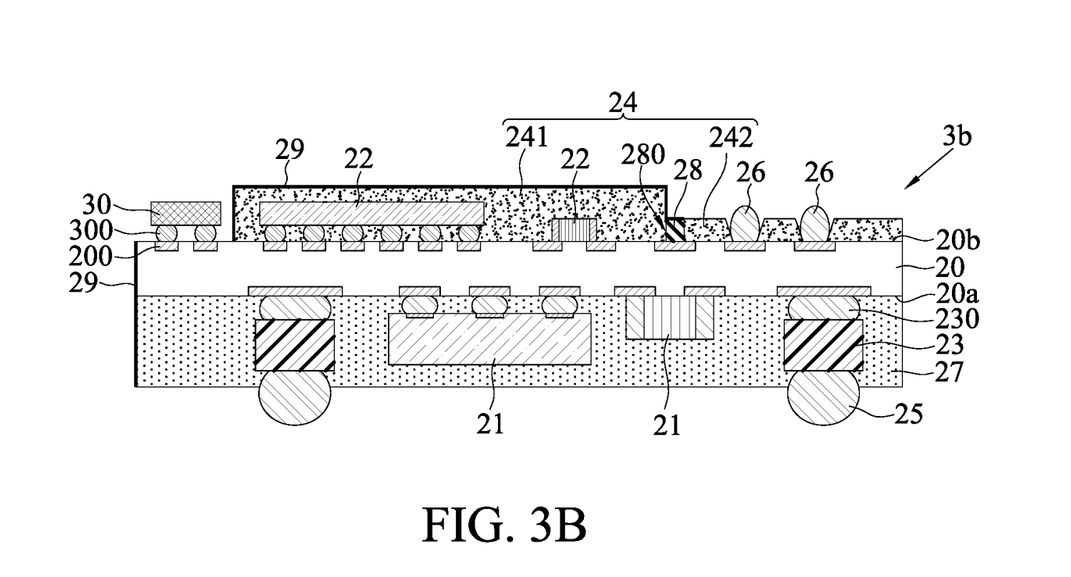

Furthermore, the encapsulation layer 24 can cover the entire surface of the second side 20b of the carrier structure 20; in other embodiments, the range or the scope of the encapsulation layer 24 can be adjusted according to requirements, such as an electronic package 3b shown in FIG. 3B, where the encapsulation layer 24 is only formed on a portion of a surface of the second side 20b of the carrier structure 20, such that at least one electronic connector 30 is disposed on the exposed area of the second side 20b of the carrier structure 20 for connecting onto the connecting port of the motherboard of the electronic products. For example, the electronic connector 30 can be disposed on the circuit layer 200 of the second side 20b of the carrier structure 20 via soldering (e.g., via solder bumps 300 as shown in FIG. 3B) or other means.

Figure 3C:
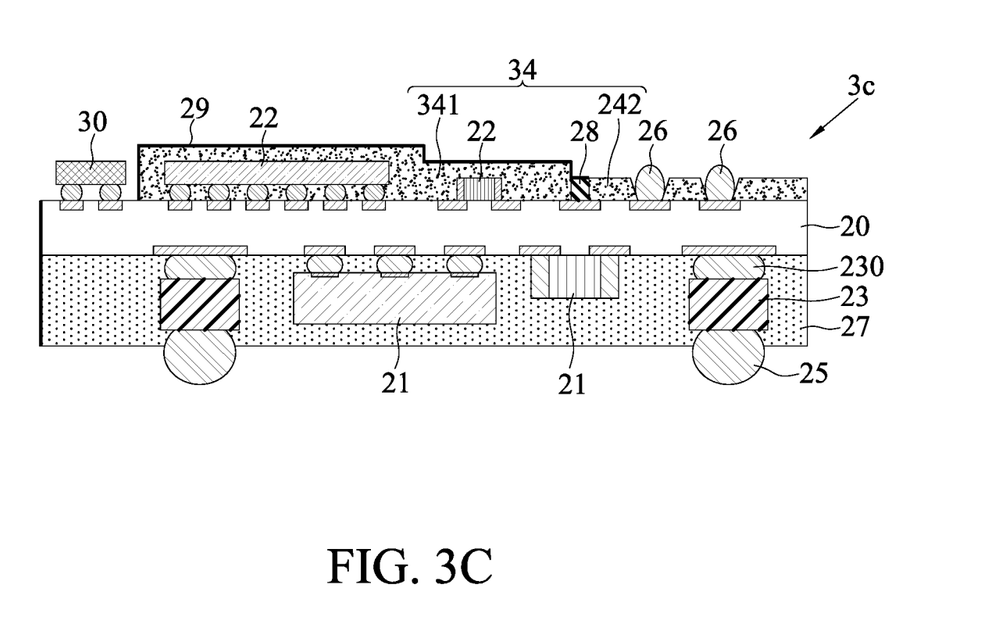

In addition, the contour of the encapsulation layer 24 can be adjusted according to the space requirements of electronic products. For example, when the heights of the second electronic elements 22 relative to the second side 20b of the carrier structure 20 are not uniform, a first encapsulation portion 341 with a concave-convex shape can be formed according to the heights of the second electronic elements 22 relative to the second side 20b of the carrier structure 20, such as a step-shaped encapsulation layer 34 of an electronic package 3c as shown in FIG. 3C. The contour of the encapsulation layer 24 can be changed according to requirements, and the present disclosure is not limited to as such.

Figure 2E:
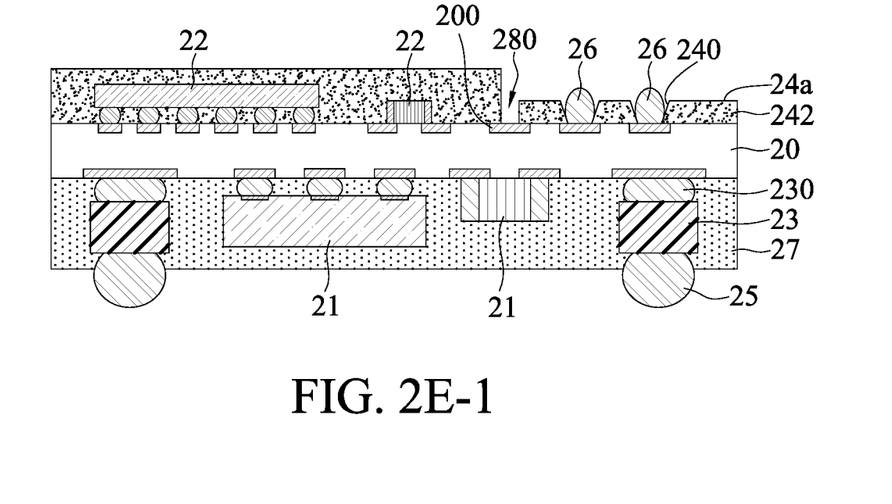
Figure 2E:
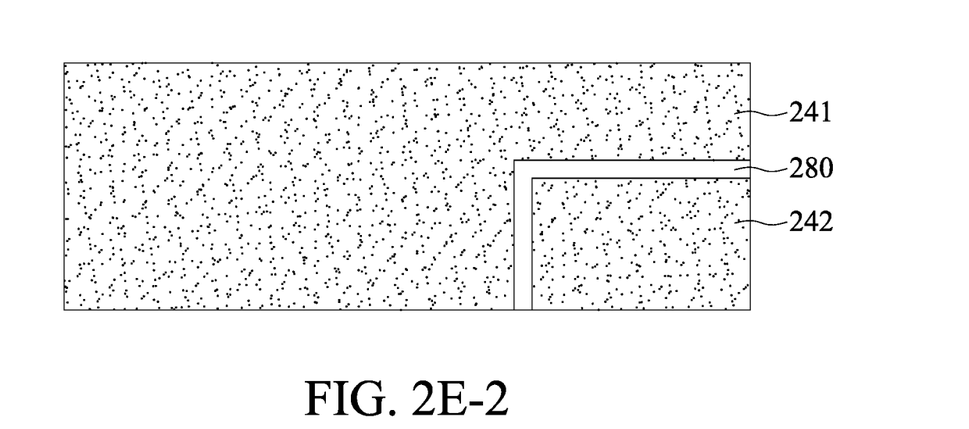

As shown in FIG. 2E-1, a plurality of openings 240 and at least one groove 280 are formed on the second encapsulation portion 242 of the encapsulation layer 24, so that the first conductive structures 26 are exposed from the openings 240, such that the first conductive structures 26 are used as contacts (I/O), and the groove 280 is exposed from the surface of the second side 20b of the carrier structure 20. Then, a part of the material of the packaging layer 27 is removed, such that the conductive elements 25 are exposed from the packaging layer 27.

In an embodiment, the contact function of the first conductive structure 26 may be a signal pin, a contact for surface mount technology (SMT), or other purposes. Therefore, in another embodiment, a circuit structure 46 can be disposed on the second side 20b of the carrier structure 20, such as an electronic package 4 shown in FIG. 4, so that one side of the circuit structure 46 is electrically connected to the circuit layer 200 on the second side 20b of the carrier structure 20 via a plurality of conductive bumps 460, and the other side of the circuit structure 46 is arranged with first conductive structures 461 for connecting to other packaging modules. For example, the circuit structure 46 is a circuit block with a redistribution layer (such as in the form of a substrate or a ring/annular frame of the circuit board 23) to serve as an interposer.

Further, the openings 240 and the groove 280 are formed by laser cauterization, so that there is a gap between an end portion of the first conductive structure 26 and the opening 240, and the end portion of the first conductive structure 26 may be higher than, lower than, or flush with a surface 24a of the second encapsulation portion 242 of the encapsulation layer 24. In other embodiments, as shown in FIG. 3A, a leveling/flattening process, such as grinding, may be performed to remove part of the material of the first conductive structures 36 and the second encapsulation portion 242, so that end surfaces 36a of the first conductive structures 36 and the surface 24a of the second encapsulation portion 242 of the encapsulation layer 24 are coplanar (i.e., both are flush), and the first conductive structures 36 are exposed from the second encapsulation portion 242. Therefore, there are many ways in which the first conductive structure can be exposed from the second encapsulation portion, and the present disclosure is not limited to as such.

Furthermore, the groove 280 is formed between the first encapsulation portion 241 and the second encapsulation portion 242, and can be arranged along an edge of the second encapsulation portion 242, as shown in FIG. 2E-2, and exposes the circuit layer 200 on the second side 20b of the carrier structure 20.

In addition, a part of the material of the packaging layer 27 can be removed by grinding, etching, burning, cutting, or other suitable methods, such that the conductive elements 25 are exposed from the packaging layer 27.

Figure 2F:
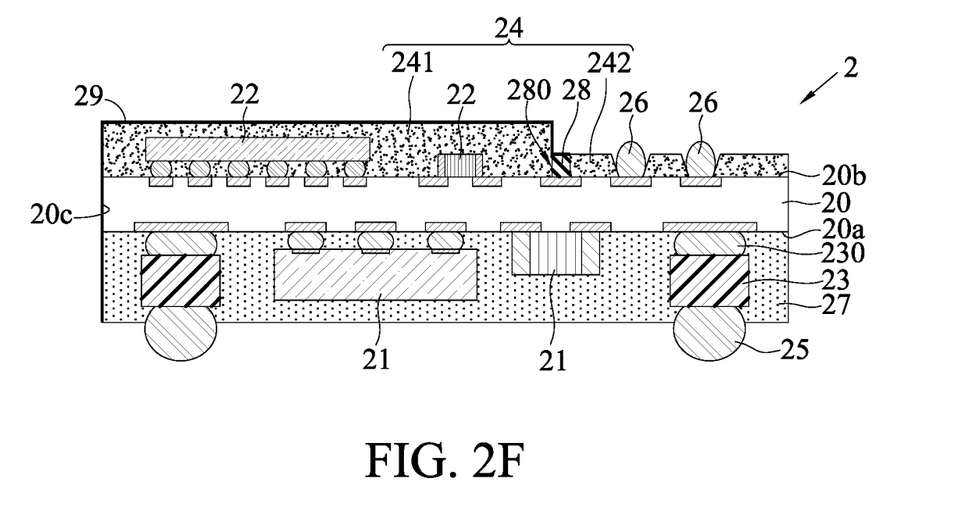

As shown in FIG. 2F, a second conductive structure 28 is formed in the groove 280, so that the second conductive structure 28 is electrically connected to the circuit layer 200 on the second side 20b of the carrier structure 20, thereby obtaining the electronic package 2 of the present disclosure.

In an embodiment, the second conductive structure 28 is a conductive adhesive/glue, such as silver glue, copper paste, or other suitable adhesives/glues.

Further, the second conductive structure 28 can serve as a ground. For example, a shielding structure 29 is formed on the encapsulation layer 24 and in contact with the second conductive structure 28, so that the shielding structure 29 covers the second electronic elements 22, and the second electronic elements 22 are thus not affected by external electromagnetic interference. Moreover, a layout area of the shielding structure 29 can be selected to extend to a side surface 20c of the carrier structure 20 according to requirements, so as to contact the circuit layer of the side surface 20c of the carrier structure 20, such that the shielding structure 29 is grounded to achieve the shielding effect. The shielding structure 29 can even extend to the packaging layer 27 to protect the first electronic elements 21 from external electromagnetic interference.

In addition, the shielding structure 29 can be formed on the encapsulation layer 24 by a process of coating a metal layer (such as copper), such as sputtering, vaporing, electroplating, electroless plating, or chemical plating, etc. Alternatively, the shielding structure 29 is formed on the encapsulation layer 24 by covering with a metal frame or a metal cover, or by means of foiling. It should be understood that there are many ways of shielding, and the present disclosure is not limited to as such.

Therefore, with the electrical connection between the second conductive structure 28 and the shielding structure 29, the shielding structure 29 can be connected to the grounding circuit of the circuit layer 200 of the carrier structure 20 via the second conductive structure 28 to achieve the shielding effect.

In addition, the electronic package 2 can be disposed on an electronic device (not shown) such as a circuit board via the conductive elements 25 in the subsequent process.

Therefore, in the manufacturing method of the present disclosure, the first conductive structures 26, 36, 461 are disposed on the second side 20b of the carrier structure 20 and exposed from the encapsulation layer 24, so as to externally connect required elements according to functional requirements (such as antennas), so that the layout area of the carrier structure 20 can be designed based on a mold of the encapsulation layer 24 without increasing the layout area of the carrier structure 20. Therefore, compared with the prior art, the manufacturing method of the present disclosure can reduce the volume of the electronic package 2, 3a, 3b, 3c, 4 to meet the requirements of being light, thin and short in the electronic package 2, 3a, 3b, 3c, 4.

In addition, the shielding structure 29 does not need to cover the first conductive structures 26, 36, 461 by arranging the second conductive structure 28 on the second side 20b of the carrier structure 20 (where the second conductive structure 28 is exposed from the encapsulation layer 24), thereby reducing the layout area of the shielding structure 29 to save the material of the shielding structure 29. Therefore, the manufacturing method of the present disclosure can reduce the manufacturing cost of the electronic package 2, 3a, 3b, 3c, 4.

Also, the second conductive structure 28 is designed to shield a periphery/surrounding of the second electronic elements 22, so that the second electronic elements 22 and the first conductive structures 26, 36, 461 will not interfere with each other electromagnetically, thereby improving the reliability of the end product.

The present disclosure further provides an electronic package 2, 3a, 3b, 3c, 4, which comprises: a carrier structure 20 having at least one circuit layer 200, at least one first electronic element 21, a circuit board 23, at least one second electronic element 22, at least one first conductive structure 26, 36, 461, an encapsulation layer 24, 34 and a second conductive structure 28.

The carrier structure 20 has a first side 20a and a second side 20b opposing the first side 20a.

The first electronic element 21 is disposed on the first side 20a of the carrier structure 20 and electrically connected to the circuit layer 200.

The circuit board 23 is disposed on the first side 20a of the carrier structure 20 and electrically connected to the circuit layer 200.

The second electronic element 22 is disposed on the second side 20b of the carrier structure 20 and electrically connected to the circuit layer 200.

Figure 4:
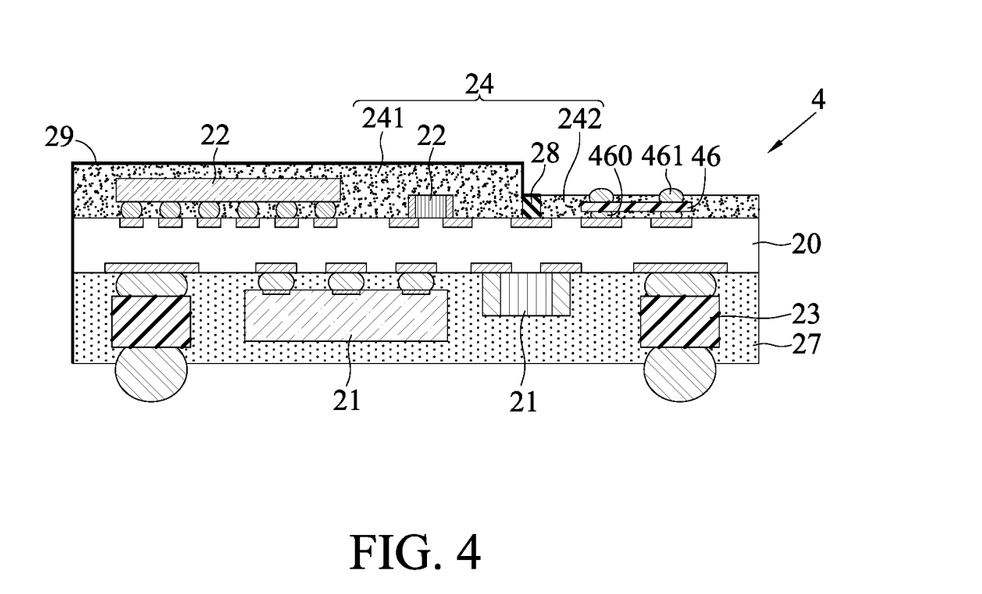
FIG. 4 is a schematic cross-sectional view of an electronic package according to another embodiment of the present disclosure.

The first conductive structure 26, 36, 461 is disposed on the second side 20b of the carrier structure 20 and electrically connected to the circuit layer 200.

The encapsulation layer 24, 34 is disposed on the second side 20b of the carrier structure 20 to cover the second electronic element 22 and the first conductive structure 26, 36, 461, and the encapsulation layer 24, 34 is defined with a first encapsulation portion 241, 341 and a second encapsulation portion 242 that are formed integrally, so that the second electronic element 22 is located in the first encapsulation portion 241, 341, and the first conductive structure 26, 36, 461 is located in the second encapsulation portion 242, wherein a height H1 of the first encapsulation portion 241, 341 is higher/greater than a height H2 of the second encapsulation portion 242, and the first conductive structure 26, 36, 461 is exposed from the second encapsulation portion 242.

The second conductive structure 28 is disposed on the second side 20b of the carrier structure 20 and electrically connected to the circuit layer 200, wherein a composition of the second conductive structure 28 is different from a composition of the first conductive structure 26, 36, 461.

In one embodiment, the circuit board 23 is in a form of a ring frame.

In one embodiment, the first conductive structure 26, 36, 461 is a solder ball or a metal pillar.

In one embodiment, the second conductive structure 28 is a conductive adhesive.

In one embodiment, a portion of a surface of the second side 20b of the carrier structure 20 is exposed from the encapsulation layer 24, 34 to connect to an electronic connector 30.

In one embodiment, the first encapsulation portion 341 has a contour in concave-convex shape.

In one embodiment, the electronic package 4 further comprises a circuit structure 46 carrying the first conductive structure 461 and disposed on the second side 20b of the carrier structure 20.

In one embodiment, the electronic package 4 further comprise a packaging layer 27 covering the first electronic element 21 and the circuit board 23. For example, a plurality of conductive elements 25 are disposed on the circuit board 23, so that the plurality of conductive elements 25 are exposed from the packaging layer 27.

In one embodiment, the electronic package 2, 3a, 3b, 3c, 4 further comprises forming a shielding structure 29 on the encapsulation layer 24, 34, and the shielding structure 29 is electrically connected to the second conductive structure 28.

In view of the above, in the electronic package and manufacturing method thereof according to the present disclosure, the first conductive structure is disposed on the second side of the carrier structure and exposed from the encapsulation layer, so as to externally connect required elements according to functional requirements, so that a layout area of the carrier structure can be designed based on a mold of the encapsulation layer without increasing the layout area of the carrier structure. Therefore, the present disclosure can reduce the volume of the electronic package to meet the requirements of being light, thin and short in the electronic package.

In addition, the second conductive structure is designed to shield a surrounding of the second electronic element, so that the second electronic element and the first conductive structure will not interfere with each other electromagnetically, thereby improving the reliability of the end product.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
   a carrier structure having at least one circuit layer and being defined with a first side and a second side opposing the first side;
   at least one second electronic element disposed on the second side of the carrier structure and electrically connected to the circuit layer;
   at least one first conductive structure disposed on the second side of the carrier structure and electrically connected to the circuit layer;
   an encapsulation layer formed on the second side of the carrier structure to cover the second electronic element and the first conductive structure, the encapsulation layer being defined with a first encapsulation portion and a second encapsulation portion that are integrally formed, wherein the second electronic element is located in the first encapsulation portion, and the first conductive structure is located in the second encapsulation portion, wherein a height of the first encapsulation portion is greater than a height of the second encapsulation portion, and the first conductive structure is exposed from the second encapsulation portion; and
   a second conductive structure disposed on the second side of the carrier structure and between the first encapsulation portion and the second encapsulation portion, electrically connected to the circuit layer, and having a composition different from a composition of the first conductive structure.

2. The electronic package of claim 1, wherein the first conductive structure is a solder ball or a metal pillar.

3. The electronic package of claim 1, wherein the second conductive structure is a conductive adhesive.

4. The electronic package of claim 1, wherein a portion of a surface of the second side of the carrier structure is exposed from the encapsulation layer to connect to an electronic connector.

5. The electronic package of claim 1, wherein the first encapsulation portion has a contour in concave-convex shape.

6. The electronic package of claim 1, further comprising a circuit structure carrying the first conductive structure and disposed on the second side of the carrier structure.

7. The electronic package of claim 1, further comprising:
   at least one first electronic element disposed on the first side of the carrier structure and electrically connected to the circuit layer; and
   a circuit board disposed on the first side of the carrier structure and electrically connected to the circuit layer.

8. The electronic package of claim 7, wherein the circuit board is in a form of a ring frame.

9. The electronic package of claim 7, further comprising a plurality of conductive elements formed on the circuit board to connect to an electronic device.

10. The electronic package of claim 1, further comprising a shielding structure formed on the encapsulation layer and electrically connected to the second conductive structure.

11. A method of manufacturing an electronic package, comprising:
    providing a carrier structure having at least one circuit layer, the carrier structure being defined with a first side and a second side opposing the first side;
    disposing at least one second electronic element and at least one first conductive structure on the second side of the carrier structure, wherein the second electronic element and the first conductive structure are electrically connected to the circuit layer;
    forming an encapsulation layer on the second side of the carrier structure to cover the second electronic element and the first conductive structure, the encapsulation layer being defined with a first encapsulation portion and a second encapsulation portion that are integrally formed, wherein a height of the first encapsulation portion is greater than a height of the second encapsulation portion, wherein the second electronic element is located in the first encapsulation portion, and the first conductive structure is located in the second encapsulation portion and exposed from the second encapsulation portion; and
    forming a second conductive structure on the second side of the carrier structure and between the first encapsulation portion and the second encapsulation portion, wherein the second conductive structure is electrically connected to the circuit layer, and has a composition different from a composition of the first conductive structure.

12. The method of claim 11, wherein the first conductive structure is a solder ball or a metal pillar.

13. The method of claim 11, wherein the second conductive structure is a conductive adhesive.

14. The method of claim 11, wherein a portion of a surface of the second side of the carrier structure is exposed from the encapsulation layer to connect to an electronic connector.

15. The method of claim 11, wherein the first encapsulation portion has a contour in concave-convex shape.

16. The method of claim 11, further comprising disposing a circuit structure carrying the first conductive structure on the second side of the carrier structure.

17. The method of claim 11, further comprising disposing at least one first electronic element and a circuit board on the first side of the carrier structure, wherein the first electronic element and the circuit board are electrically connected to the circuit layer.

18. The method of claim 17, wherein the circuit board is in a form of a ring frame.

19. The method of claim 17, further comprising forming a plurality of conductive elements on the circuit board to connect to an electronic device.

20. The method of claim 11, further comprising forming a shielding structure on the encapsulation layer, wherein the shielding structure is electrically connected to the second conductive structure.

* * * * *